United States Patent [19]

Damen et al.

[11] 4,378,599
[45] Mar. 29, 1983

[54] SEMICONDUCTOR LASER HAVING BROADBAND LASER GAIN

[75] Inventors: Theodoor C. Damen, Colts Neck; Michel A. Duguay, Fair Haven; Julian Stone, Rumson, all of N.J.

[73] Assignee: Bell Telephone Laboratories, Incorporated, Murray Hill, N.J.

[21] Appl. No.: 240,205

[22] Filed: Mar. 3, 1981

[51] Int. Cl.³ .............................................. H01S 3/18
[52] U.S. Cl. ..................................................... 372/43
[58] Field of Search ............................ 372/43, 20, 70; 330/4.3

[56] References Cited

PUBLICATIONS

Moriya et al., "Luminescence Due to Metallic Electron-Hole Liquid in GaAs", *Solid State Communications*, vol. 14, 1974, pp. 245–248.

Hayashi et al., "Pico-Second Spectroscopy of Highly Excited CdSe and CdS-I High Density Exciton System", *Solid State Communications*, vol. 24, 1977, pp. 833–836.

Saito et al., "Pico-Second Spectroscopy of Highly Excited CdSe and CdS-II High Density Electron-Hole Plasma", *Solid State Communications*, vol. 24, 1977, pp. 837–840.

Shah, "Hot Electrons and Phonons Under High Intensity Photo Excitation of Semiconductors", *Solid State Electronics*, vol. 21, 1978, pp. 43–50.

Passner et al., "Ultra-Short Laser: Lasing in MBE GaAs Layer with Perpendicular-to-Film Optical Excitation", *Technical Memorandum*, No. 79-1115-2, Jan. 3, 1979, pp. 1–11.

Yunovich et al., "Dependence of Stimulated Emission from Thin $PbS_{1-x}Se_x$ Films on Temperature in the 50°–300° K. Range", *Sov. Phys. Semi.*, vol. 13, No. 9.

Gribkovskii et al., "Lasing in ZnTe, ZnSe, and CdS Single Crystals Excited by Ruby Laser Picosecond Pulses", *Sov. J. Quantum Electron.*, vol. 9, No. 10, Oct. 1979, pp. 1305–1307.

Stone et al., "Laser Action in Photopumped GaAs Ribbon Whiskers", *J. Appl. Phys.*, vol. 51, No. 6, Jun. 1980, pp. 3038–3041.

Duguay et al., "Picosecond Pulses from an Optically Pumped Ribbon-Whisker Laser", *Appl Phys. Lett.*, vol. 37, No. 4, Aug. 15, 1980, pp. 369–370.

Shah et al., "Hot-Carrier Relaxation in Photoexcited $In_{0.53}Ga_{0.47}As$", *Appl. Phys. Lett.*, vol. 37, No. 5, Sep. 1980, pp. 475–477.

*Primary Examiner*—James W. Davie
*Attorney, Agent, or Firm*—Michael B. Einschlag; Daniel D. Dubosky

[57] ABSTRACT

Broadband laser gain is obtained in semiconductor materials by pumping an ultra-short laser cavity with picosecond excitation pulses. The broadband laser gain is used to provide picosecond laser radiation energy covering a wide spectrum of frequencies.

6 Claims, 1 Drawing Figure

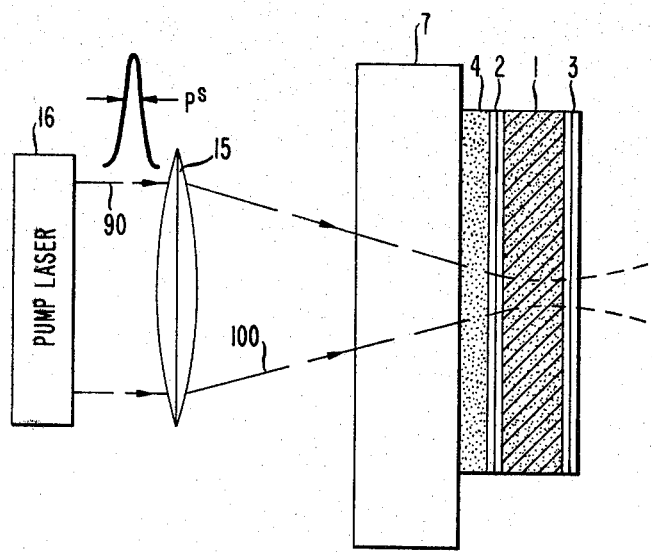

SEMICONDUCTOR LASER HAVING BROADBAND LASER GAIN

BACKGROUND OF THE INVENTION

The present invention pertains to the field of semiconductor lasers.

Semiconductor lasers typically provide laser output having a very narrow spectrum. These lasers are typically thought to be monochromatic, the laser radiation frequency corresponding to the energy between the valence and the conduction bands in the material. Attempts to produce laser radiation from electron levels at substantial distances away from the conduction band-gap have met with little success. In particular, many previous attempts to fill the conduction band have resulted in material damage.

Furthermore, there have been attempts to study hot electrons under high intensity photoexcitation of semiconductors. These studies have generally kept the semiconductor material at very low temperatures and have not produced laser action. See for example articles entitled: "Hot Electrons and Photons Under High Intensity Photoexcitation of Semiconductors", *Solid State Electronics*, Vol. 21, 1978, pp. 43–50 by J. Shah, "Pico-Second Spectroscopy of Highly Excited CdSe and CdS-I $\beta$ II High Density Excitation System", *Solid State Comm.*, Vol. 24, 1977, pp. 833–840, by M. Hayashi, H. Saito, and S. Shionoya and "Luminescence Due to Metallic Electron-Hole Liquid InGaAs", *Solid State Comm.*, Vol. 14, 1974, pp. 245–248, by T. Moriya and T. Kushida.

Even results showing stimulated emission from thin films of semiconductor material disclosed in articles entitled "Dependence of Stimulated Emission from Thin $PbS_{1-x}Se_x$ Films On Temperature in the 50°–300° K. Range", *Sov. Phys. Semicond.*, Vol. 13, No. 9, September 1979, pp. 988–991, by A. E. Yunovich, A. S. Averyushkin, I. A. Drozel, and V. G. Ogneva and "Lasing in ZnTe, ZnSe, and CdS Single Crystals Excited by Ruby Laser Picosecond Pulses", *Sov. J. Quantum Electron.*, Vol. 9, No. 10, October 1979, pp. 1305–1307, by V. P. Gribkovsku, V. A. Zaporozhchenko, V. A. Ivanov, A. V. Kochinsku, V. V. Parashchuk, and G. P. Yablonsku do not exhibit wide spectrum laser output.

SUMMARY OF THE INVENTION

Broadband laser gain is obtained by pumping a semiconductor material, disposed in an ultra-short laser cavity, with high intensity excitation pulses having an ultra-short time duration. The time duration of the excitation pulses should be less than or substantially equal to a picosecond. The intense excitation heats up the electron-hole plasma and the crystal lattice, so that after a short time it is not possible to get laser action over the full bandwidth because the gain bandwidth and gain amplitude have been severely reduced by the temperature increase in the crystal. Correspondingly, the thickness of the material should be less than or substantially equal to 1 $\mu$m.

This broadband laser gain is used to provide laser radiation covering a wide spectrum of frequencies. In one embodiment the excitation is provided by picosecond pulses of laser radiation.

BRIEF DESCRIPTION OF THE DRAWING

A complete understanding of the present invention may be gained from a consideration of the detailed description presented hereinbelow in connection with the accompanying diagram in which:

The FIGURE shows, in pictorial form, an embodiment of the present invention which utilizes a thin film of GaAs as a lasing material and a picosecond laser excitation pulse to provide a broadband laser gain at room temperature.

DETAILED DESCRIPTION

The FIGURE shows an embodiment of the present invention. Film 1 is a thin film of semiconductor material, e.g. GaAs, having substantially parallel sides. Dielectric layers 2 and 3 are affixed to both sides of film 1 to form an ultra-short laser cavity. The laser cavity formed by dielectric layers 2 and 3 is affixed by glue layer 4 to glass substrate 7 for ease of handling. High intensity picosecond pulses of radiation 90, provided by pump laser 16 and focused by lens 15 to produce beam 100, impinge upon film 1 at room temperature. The unique combination wherein a semiconductor material is highly excited by picosecond optical pulses and placed in an ultra-short laser cavity produces a high electron-hole pair density which fills the conduction band in the semiconductor to levels which have not been achieved previously. The laser pump pulse has photons with an energy larger than the bandgap between the valence and conduction band and laser action is produced at energies far above the bandgap. For example, we have observed laser gain and lasing in GaAs at wavelengths in the range of wavelengths 7700 Å–8900 Å.

We have utilized a laser source to produce 0.9 picosecond pulses and a focusing system to focus the pulses to a 5 $\mu$m diameter spot size. This produced a pumping power density on the order of 5 GW/cm$^2$ at the focus of beam 100 in film 1. This pumping power density corresponds to a pumping energy flux of 5 mJ/cm$^2$ and produced an electron-hole pair density in film 1 on the order of $2 \times 10^{20}$/cm$^3$. It is important to note that the relatively high quasifermi level of electrons and the nonequilibrium electron gas resulting from this high carrier density produces gain over much larger bandwidths than are achieved in the conventional injection-type semiconductor lasers. It is also important that the excitation pulses be less than or on the order of picosecond duration in order to prevent damage to the semiconductor material which would occur if the pulses were in the nanosecond range.

Effective operation of embodiments of the present invention requires ultra-short cavities in order that: 1. the appropriate electron-hole pair densities be generated in a volume of the laser material without damaging the material and 2. the photons generated can make a sufficient number of round-trips in the cavity to cause lasing before the electron-hole pair density decays. (With crystal thicknesses in the range of 0.6–1.0 $\mu$m, ultrashort laser cavities were made that exhibited round-trip times of only 40–50 femtoseconds.)

The above-described conditions enable us to estimate the appropriate pulse duration for the excitation and the appropriate thickness of the semiconductor material. Of course, it should be clear to those skilled in the art that specific conditions depend on the semiconductor materials utilized. In order to achieve the shortest possible wavelength in a thin film GaAs laser, two conditions must simultaneously be met: 1. the pump pulse duration must be less than 10 picoseconds and 2. the semiconductor film thickness must be less than 3 microns.

The 10 ps pulse duration limit arises from the fact that the lifetime of the high-density electron-hole plasma in GaAs is limited by Auger recombination and by bimolecular recombination. The Auger recombination lifetime decreases with the square of the electron-hole density whereas the bimolecular recombination lifetime decreases linearly with carrier density. The observed result is that at electron-hole pair densities on the order of $3 \times 10^{20}$ electron-hole pairs per cc the population inversion has been sufficiently reduced 10 ps after pumping with a 1 ps pulse that laser action has been greatly reduced in power.

The 3 micron limit on thickness arises from the need to fill the whole thickness of the semiconductor film with the electron-hole plasma. Because of the high absorption coefficient of GaAs, the pump light is almost all absorbed in the first half-micron. Within a few picoseconds the electron-hole plasma expands to fill out the whole thickness. The speed of expansion has been observed to be on the order of $0.5\mu$ per picosecond. In view of this, it is clear that for a thickness exceeding $3\mu$ the plasma expansion time will make the laser turn on at a time too late to take advantage of the full electron-hole population initially present. For a $3\mu$ film the plasma expansion time is about 6 ps. If we add about 1 ps to this for laser buildup time we have a delay of 7 ps. In view of the 10 ps time limit discussed earlier, it is clear that $3\mu$ is an upper limit on the thickness. Of course, it should be clear to those skilled in the art that further embodiments of the present invention would also utilize other semiconductor materials such as ternary and quaternary semiconductor III-V compounds and II-VI compounds such as CdSe. Indeed broadband laser radiation covering 6450 to 6850 angstroms has been achieved from a 1 $\mu$m thick sample of CdSe. This would require photon energies in the pumping radiation larger than that of the bandgap of the particular semiconductor material. Pulse durations would also vary due to different damage thresholds and rate of recombination of electron-hole pairs. For example we have also produced laser action in InGaAsP semiconductor material placed in similar structures, where, of course we changed the mirror reflectivities to be suitable for the wavelength range of 1.14–1.34$\mu$ where such InGaAsP materials lase.

The generation rate of the electron-hole plasma should not exceed the optical breakdown of the material and the duration of the excitation pulses should be as such as not to melt the material. The thickness of the laser material should be less than or substantially equal to the distance at which the electron-hole plasma produced fills most of the said thickness of laser material. This is done by bleaching through the material or by hydrodynamic expansion of the electron-hole plasma when bleaching is not possible.

An embodiment of the present invention utilizing GaAs may be fabricated as follows:

1. Grow a $4\mu$ thick buffer layer of $A_{0.65}Ga_{0.35}As$ onto a $100\mu$ GaAs substrate by liquid phase epitaxy (LPE).
2. Grow a $0.6\mu \rightarrow 1.4\mu$ thick GaAs film on the $A_{0.65}Ga_{0.35}As$ buffer layer.
3. Coat the surface of the GaAs film opposite the buffer layer with dielectric layers 2 having reflectivity of 99 percent at wavelengths between 770 and 890 nm, dielectric mirrors 2 should transmit a substantial portion, e.g. 80 percent, of the radiation from pump laser 16. In one embodiment laser pulse 90 at 615 nm was produced by pumping Spectra-Physics synchronously pumped dye laser Model No. 343-02, equipped with Spectra-Physics cavity dumper Model No. 344-5, with laser radiation from Spectra-Physics argon laser Model No. 171-19, equipped with Spectra-Physics mode locker Model No. 342-501.
4. Glue the wafer by means of transparent epoxy to glass substrate 7, as shown in the FIGURE.
5. Apply a "stop-etch" technique first to the $100\mu$ GaAs substrate and then to the $A_{0.65}Ga_{0.35}As$ buffer layer to expose film 1.
6. Coat film 1 with dielectric layers 3 having a 95 percent reflectivity at wavelengths between 770 and 890 nm.

It should be clear to those skilled in the art as how the broadband laser gain in a semiconductor material produced according to the present invention is used to provide laser radiation at the various frequencies in the region of gain according to the embodiment shown in the FIGURE. The wavelengths at which laser action is observed are determined by the positions of the Fabry-Perot modes of the laser cavity. These in turn are determined by the condition that an integral number of half-wavelengths fit between the two laser cavity mirrors. We do note that due to the high energy excitation mechanism it may be impossible to predict with absolute certainty the index of refraction of radiation in the lasing material and so some walk-off of laser action in the modes may be expected. This of course can be determined and accounted for in each particular case by straightforward experimentation.

If the mirrors are not deposited on the semiconductor material as shown in the FIGURE, but are glued on, e.g. with thin layers of transparent epoxy, the extra spacing must be taken into account for computing the laser cavity separation. If the glue layer is as small as $0.1\mu$ then one could assume that this layer was a part of the dielectric mirror in a first approximation.

What is claimed is:

1. A laser which comprises:
    a semiconductor material (1) having substantially parallel sides, said material being disposed between reflecting surfaces (2 and 3);
    means (15 and 16) for exciting said semiconductor material with a high intensity excitation pulse having an ultra-short time duration, the intensity of said excitation pulse being at least as great as 3 GW/cm$^2$, the time duration of said excitation pulse being less than or substantially equal to one picosecond, the thickness of said laser semiconductor material being less than or substantially equal to 1 $\mu$m, whereby a broadband laser gain at energies above the energy difference between the conduction and valence bands is produced.

2. A laser in accordance with claim 1 wherein said means for exciting said laser semiconductor material includes a source of laser radiation, said radiation having photons with energy larger than the bandgap between the valence and conduction bands in said material.

3. A laser in accordance with claim 2 wherein said laser material is a binary III-V or II-VI semiconductor material or a ternary or quaternary III-V semiconductor material.

4. A laser in accordance with claim 3 wherein said laser material is GaAs.

5. A laser in accordance with claim 4 wherein said laser material is CdSe.

6. A laser in accordance with claim 3 wherein said alloy is a quaternary compound of InGaAsP.

* * * * *